United States Patent
Ansari et al.

(10) Patent No.: US 10,658,460 B2
(45) Date of Patent: May 19, 2020

(54) SEMI-METAL TUNNEL FIELD EFFECT TRANSISTOR

(71) Applicant: University College Cork, Cork (IE)

(72) Inventors: Lida Ansari, Cork (IE); Giorgos Fagas, Cork (IE); James Greer, Cork (IE)

(73) Assignee: University College Cork, Cork (IE)

( * ) Notice: Subject to any disclaimer, the term of this patent is extended or adjusted under 35 U.S.C. 154(b) by 0 days.

(21) Appl. No.: 15/760,074

(22) PCT Filed: Sep. 12, 2016

(86) PCT No.: PCT/EP2016/071409
§ 371 (c)(1),
(2) Date: Mar. 14, 2018

(87) PCT Pub. No.: WO2017/046024
PCT Pub. Date: Mar. 23, 2017

(65) Prior Publication Data
US 2018/0269284 A1    Sep. 20, 2018

(30) Foreign Application Priority Data

Sep. 12, 2016 (GB) .................................. 1516246.4

(51) Int. Cl.
*H01L 29/06* (2006.01)
*H01L 31/00* (2006.01)
(Continued)

(52) U.S. Cl.
CPC .......... *H01L 29/0673* (2013.01); *B82Y 10/00* (2013.01); *H01L 29/068* (2013.01);
(Continued)

(58) Field of Classification Search
CPC . H01L 29/0673; H01L 29/785; H01L 29/775; H01L 29/068; H01L 29/0669;
(Continued)

(56) References Cited

U.S. PATENT DOCUMENTS 8,373,167 B2 *  2/2013  Horch ............... H01L 21/28273
                                                       257/239
9,437,731 B2 *  9/2016  Park .................... H01L 29/7827
(Continued)

FOREIGN PATENT DOCUMENTS

| EP | 2148374 A1 | 1/2010 |
| FR | 2995450 A1 | 3/2014 |
| WO | 2014077903 A1 | 5/2014 |

OTHER PUBLICATIONS

Haixia et al., "Graphene Nanoribbon Tunneling Field-Effect Transistors With a Semiconducting and a Semimetallic Heterojunction Channel", IEEE Transactions on Electron Devices, IEEE Service Center, Piscataway, NJ, vol. 59, No. 5, May 1, 2012, pp. 1454-1461. (Year: 2012).*

(Continued)

*Primary Examiner* — Ismail A Muse
(74) *Attorney, Agent, or Firm* — Behmke Innovation Group LLC; James M. Behmke; Jonathon P. Western

(57) ABSTRACT

A tunnel field effect transistor (100) comprises a source region (102), a drain region (104), and a channel region (106) formed of a single material, in particular a half-metal. The channel extends between the source region and the drain region. The channel region (106) and the drain region (104) are smaller than a threshold size in a first dimension. The threshold size is the size required for the material to exhibit sufficient quantum confinement such that a non-zero band gap results and the material becomes a semiconductor. The (Continued)

source region (102) is larger than this threshold size in the first dimension and is thus metallic.

18 Claims, 7 Drawing Sheets

(51) Int. Cl.
| | |
|---|---|
| *B82Y 10/00* | (2011.01) |
| *H01L 29/26* | (2006.01) |
| *H01L 29/739* | (2006.01) |
| *H01L 29/775* | (2006.01) |
| *H01L 29/78* | (2006.01) |
| *H01L 29/16* | (2006.01) |

(52) U.S. Cl.
CPC ...... *H01L 29/0669* (2013.01); *H01L 29/0688* (2013.01); *H01L 29/26* (2013.01); *H01L 29/7391* (2013.01); *H01L 29/775* (2013.01); *H01L 29/785* (2013.01); *H01L 29/1606* (2013.01)

(58) Field of Classification Search
CPC . H01L 29/7391; H01L 29/26; H01L 29/0688; H01L 29/1606; B82Y 10/00
See application file for complete search history.

(56) References Cited

U.S. PATENT DOCUMENTS

| | | | | |
|---|---|---|---|---|
| 2004/0157353 | A1* | 8/2004 | Ouyang | H01L 29/1054 438/38 |
| 2007/0052012 | A1* | 3/2007 | Forbes | B82Y 10/00 257/328 |
| 2008/0068876 | A1* | 3/2008 | Sandhu | B82Y 10/00 365/149 |
| 2011/0115011 | A1* | 5/2011 | Masuoka | H01L 21/823431 257/314 |
| 2016/0071970 | A1 | 3/2016 | Hatcher et al. | |
| 2016/0254348 | A1* | 9/2016 | Bhuwalka | H01L 29/0673 257/288 |

OTHER PUBLICATIONS

Haixia et al., "Graphene Nanoribbon Tunneling Field-Effect Transistors With a Semiconducting and a Semimetallic Heterojunction Channel", IEEE Transactions on Electron Devices, IEEE Service Center, Piscataway, NJ, vol. 59, No. 5, May 1, 2012, pp. 1454-1461.

Li L. et al., "A new routine to fabricate Bi single crysalline tapering junction nanowire arrays," Applied Physics a Materials Science & Processing, Springer Berlin Heidelberg, Berlin/Heidelberg, vol. 80, No. 5, Feb. 1, 2005, pp. 1053-1055.

Noor S. Mohammad: "Understanding Quantum Confinement in nanowires: basics, applications and possible laws", Journal of Physics: Condensed Matters, Institute of Physics Publishing, Bristol, GB, vol. 26, No. 42, Sep. 23, 2014, p. 423202.

Ansari, et al., "A Proposed Confinement Modulated Gap Nanowire Transistor Based on a Metal (Tin)", Nano Letters, Apr. 2012, 2222-2227, American Chemical Society.

Ansari, et al., "Simulation of Junctionless Si Nanowire Transistors with 3 nm Gate Length", Applied Physics Letters, Aug. 2010, pp. 4 pages, American Institute of Physics, AIP Publishing.

Ansari, et al., "Strain Induced Effects on Electronic Structure of Semi-Metallic and Semiconducting Tin Nanowires", Applied Physics Letters, 105, 123105 (Sep. 2014), 5 pages, AIP Publishing LLC.

Banerjee, et al., "A New Three-Terminal Tunnel Device", IEEE Electron Device Letters, vol. EDL-8, No. 8, Aug. 1987, 347-349.

Fulde, et al., "Fabrication, Optimization and Application of Complementary Multiple-Gate Tunneling FETs", 2008 2nd IEEE International Nanoelectronics Conference, Mar. 2008, pp. 579-584, IEEE.

Hansch, et al., "A Vertical MOS-gated Esaki Tunneling Transistor in Silicon", Thin Solid Films 369 (Jul. 2000) 387-389.

Ionescu, et al., "Tunnel Field-Effect Transistors as Energy-Efficient Electronics Switches", Nature, Nov. 2011, vol. 479, pp. 329-337, Macmillian Publishers Limited.

Knoch, et al., "Impact fot he Dimensionality on the Performance of Tunneling FETs: Bulk Versus One-Dimensional Devices", Solid-State Electronics 51, (2007), 572-578, Elsevier Ltd.

Knoch, et al., "Modeling of High-Performance p-Type III-V Heterojunction Tunnel FETs", IEEE Electron Device Letters, vol. 31, No. 4, Apr. 2010, pp. 305-307, IEEE.

Kotlyar, et al., "Bandgap Engineering of Group IV Materials for Complementary n and p Tunneling Field Effect Transistors", Applied Pysics Letters, 102, 113106, Mar. 2013, 5 pages, AIP Publishing.

Ozaki et al., "Efficient Implementation of the Nonequilibrium Green Function Method for Electronic Transport Calculations", Physical Review B 81, 035116 (2010), 19 pages, The American Physical Society.

Ozaki, et al., "Numberical Atomic Basis Orbitals from H to Kr", Physical Review B 69, 195113, (2004) 19 pages, The Americal Physical Society.

Perdew, et al., "Self-Interaction Correction to Density-Functional Approximationsf or Many-Electron Systems", Physical Review B, vol. 23, No. 10, May 1981, 32 pages.

Verhulst, et al., "Complementary Silicon-Based Heterostructure Tunnel-FETs With High Tunnel Rates", IEEE Electron Device Letters, (2008), 4 pages, IEEE.

\* cited by examiner

SEMI-METAL TUNNEL FIELD EFFECT TRANSISTOR

CLAIM FOR PRIORITY

This application is a U.S. National Phase under 35 U.S.C. 371 of International Patent Application No. PCT/EP2016/071409, filed Sep. 12, 2016, which claims the priority of Great Britain Patent Application No. 1516246.4, filed Sep. 14, 2015 the entire contents of which is incorporated herein by reference in their entirety.

The present invention relates to a tunnel field effect transistor.

Field effect transistors (FETs) are the building blocks of many different integrated circuit devices, such as random-access memories, flash memories, processors, and application-specific integrated circuits. In a given device there may be many billions of FETs. There is ongoing interest in reducing the size of FETs, because smaller FETs allow higher FET density and consequently higher function per unit area at lower unit cost.

The most widely used FET is the metal-oxide-semiconductor FET (MOSFET). In modern microprocessors, MOSFETs are predominantly used for switching. While an ideal switch provides an abrupt transition from the OFF state to the ON state at room temperature, there is a physical limit for the switching slope, as the MOSFET is scaled down in size.

To overcome the physical limit of the switching slope, tunnel-FETs (TFETs) have been developed. TFETs based on heterojunctions formed between different materials improve switching performance. However, constructing nano-scale heterojunction based TFETs using different materials and with different dopant types imposes critical challenges in the device fabrication.

According to a first aspect of the invention, there is provided a tunnel field effect transistor formed of a single material, the tunnel field effect transistor comprising a source region, a drain region, and a channel region extending between the source region and the drain region, wherein: the channel region and the drain region are smaller than a threshold size in a first dimension, the threshold size being the size required for the material to exhibit sufficient quantum confinement such that it forms a semiconductor; and the source region is larger than the threshold size in the first dimension.

The TFET is constructed from a single material, without any abrupt changes in the material composition, and is therefore simpler to form than a TFET based on heterojunctions, which has boundaries where the lattice constant and/or material composition changes. Furthermore, the switching performance of the TFET at room temperature is faster than the physical limit for MOSFETs and the TFET has lower off current, and so improved switching performance and reduced power consumption can be achieved.

The tunnel field effect transistor may be formed of a nanowire incorporating the source region, the drain region and the channel region, the nanowire having a diameter or thickness in the first dimension.

The nanowire may have a cross-section that is circular, square, rectangular or triangular.

The diameter or thickness of the nanowire may be altered between the source region and the drain and channel regions, such that the channel region and the drain region exhibit sufficient quantum confinement such that the material is a semiconductor, and the source region is metallic or semi-metallic.

The channel region and the drain region may have the same diameter or thickness.

The drain region may be doped. The drain region may be either n-type doped or p-type doped. The doping concentration may be between $10^{14}$ atoms/cm$^3$ and $10^{23}$ atoms/cm$^3$, and is optionally more than $10^{20}$ atoms/cm$^3$.

The tunnel field effect transistor may comprise a doping boundary between the undoped channel region, and the doped drain region.

The doping may cause band gap narrowing in the doped region, such that the doping boundary is electronically equivalent to a heterojunction or homojunction.

The change in size from the source region to the channel region may comprise either a step change or graded change in the size.

The change in size from the source region to the channel region may cause shifts in the energy levels, such that the change in size is electronically equivalent to a step or gradual heterojunction or homojunction.

The tunnel field effect transistor may comprise a gate overlapping the channel, the gate constructed and arranged to allow or restrict conduction through the channel, wherein the gate comprises a gate electrode, and gate dielectric provided between the channel and the gate electrode, wherein the gate electrode overlaps a portion of the length of the channel or the whole length of the channel, such that the channel comprises an overlapped region where the gate overlaps the channel.

The gate may overlap a portion of the channel, such that the channel comprises one or more non-overlapped regions, where the gate does not overlap the channel.

The tunnel field effect transistor may comprise a first non-overlapped region of the channel between the source and the overlapped region, and a second non-overlapped region between the overlapped region and the drain.

The first non-overlapped region and/or the second non-overlapped region may have a length of at least three atomic layers.

The second non-overlapped region may be doped.

The material may comprise a material that behaves as a semi-metal or metal in the bulk. The material may be selected from the list including, but not limited to: tin; bismuth; antimony; arsenic; carbon; tin alloys; bismuth alloys; antimony alloys; arsenic alloys; and carbon allotropes.

The material may be an alloy including a constituent configured to introduce strain into the lattice of the material.

The threshold size required to exhibit quantum confinement may be the Fermi wavelength of the charge carriers in the material.

The tunnel field effect transistor may have a subthreshold slope of less than 60 mV/dec.

The tunnel field effect transistor may be formed from a single continuous material.

According to a second aspect, there is provided an integrated circuit comprising one or more tunnel field effect transistors according to the first aspect.

According to a third aspect, there is provided a method of forming a tunnel field effect transistor comprising: providing a body of first material; forming a drain and channel region to have a first dimension smaller than a threshold size required to exhibit quantum confinement; forming a source region, to have the first dimension larger than the threshold size required to exhibit quantum confinement, the channel extending between the source region and the drain region; doping the drain region; and forming a gate over a portion of the channel region or the whole of the channel region, such that the body forms a three terminal device.

It will be appreciated that the method may be performed in any suitable order. In particular, but not exclusively, the doping may be performed before either of the etching stages, and either etching step may occur first.

According to a fourth aspect, there is provided a tunnel field effect transistor having a source region, a drain region, and a channel region extending between the source region and the drain region, wherein: the source region exhibits metallic or semi-metallic properties; and the channel and the drain regions exhibit semiconducting properties, and at least the channel region is formed of a material that exhibits metallic or semi-metallic bulk properties, and semiconducting properties—due to sufficient quantum confinement.

There now follows, by way of example only, a description of embodiments of the invention, described with reference to the accompanying drawings, in which.

Figure 1A:
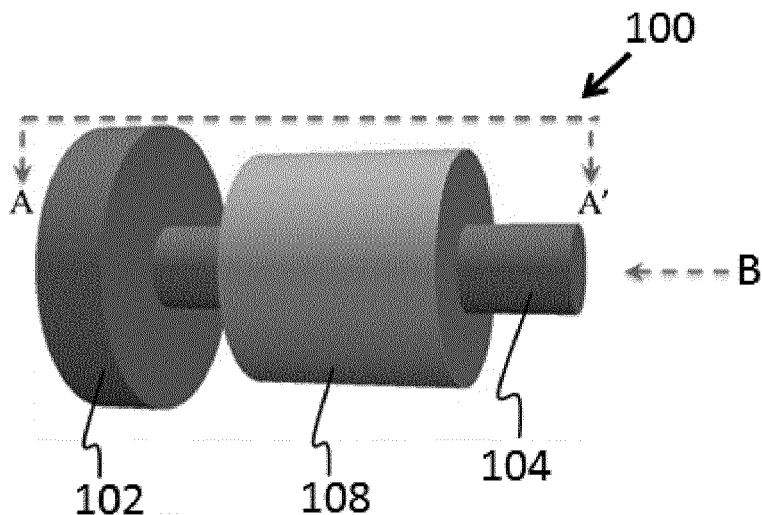
FIG. 1A is a perspective view of a schematic illustration of an example of a TFET according to the invention.
Figure 2:
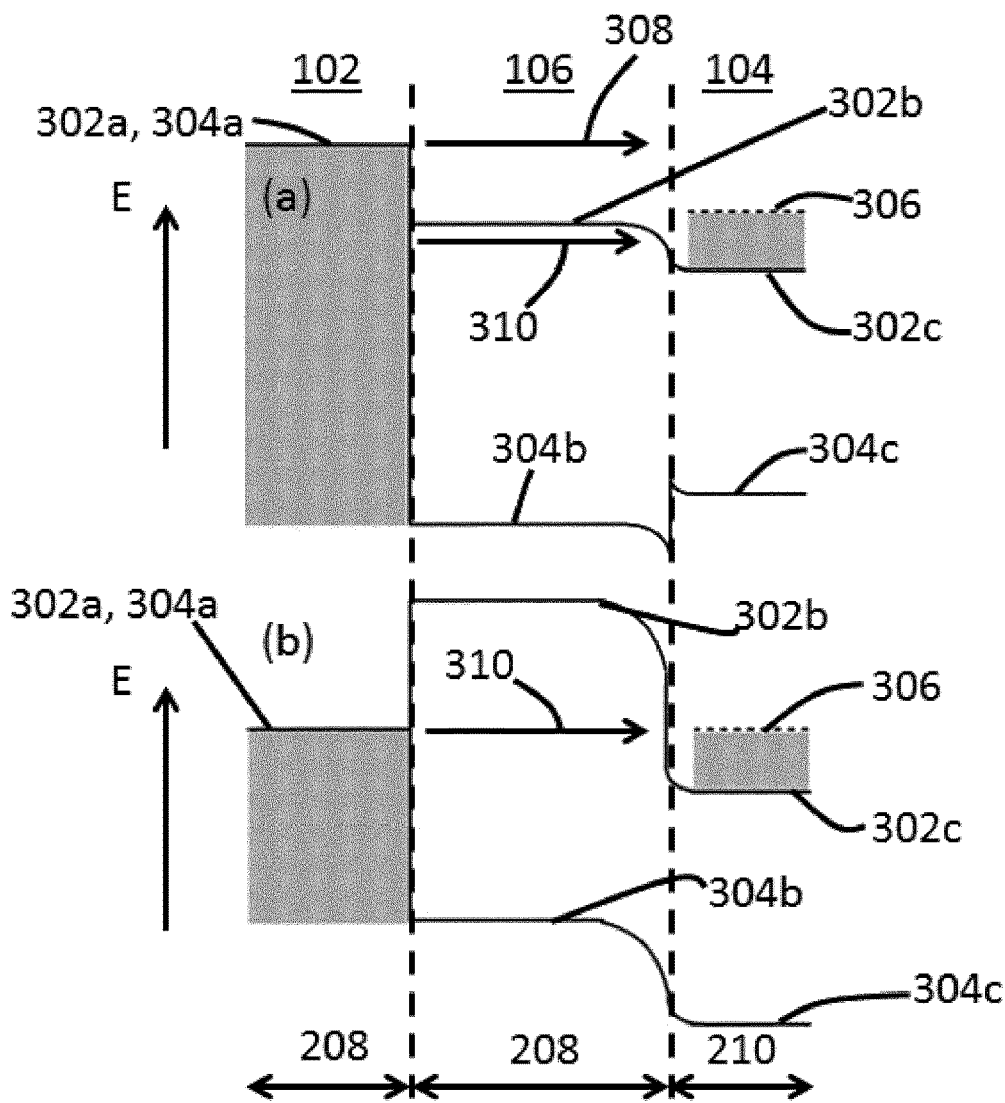
Figure 3A:
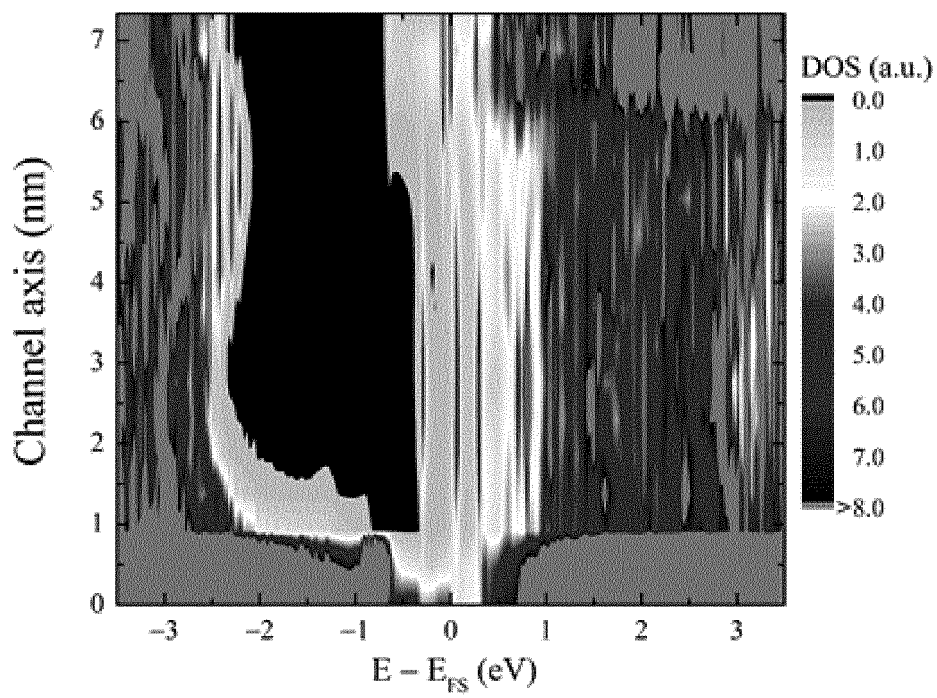
Figure 3B:
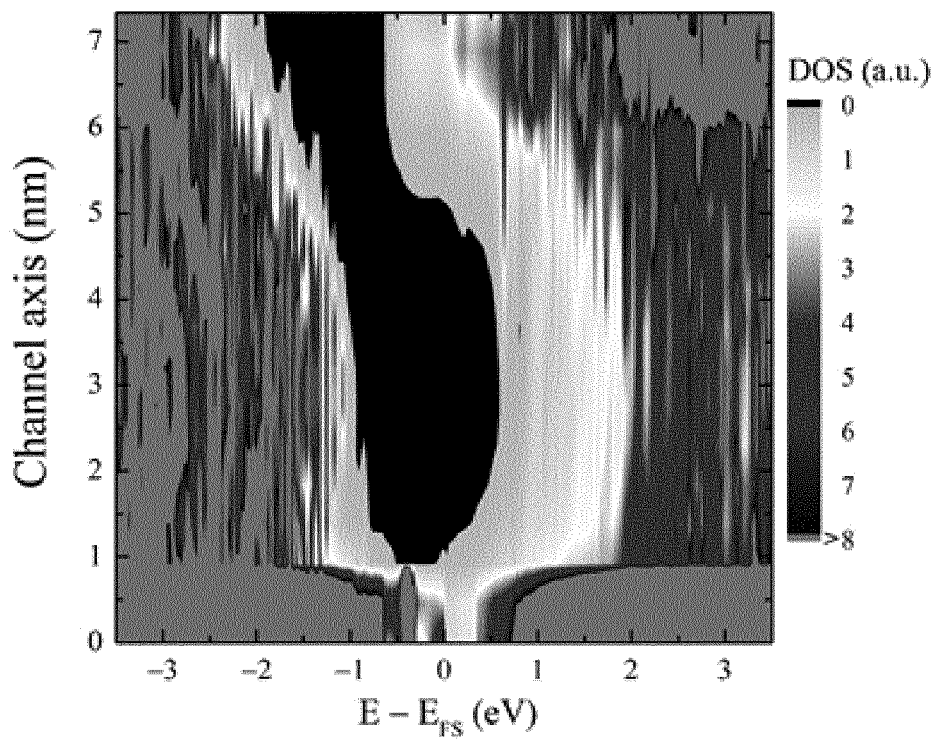
Figure 4:
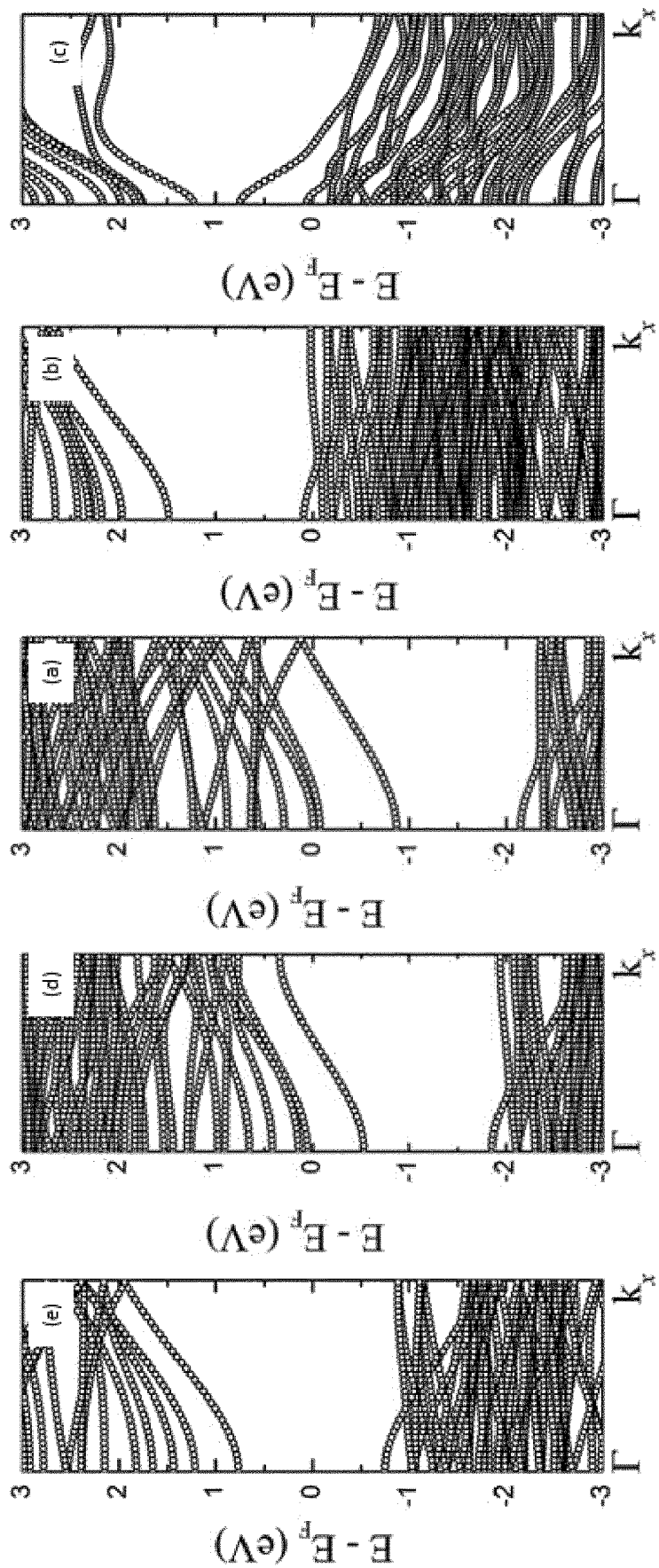
Figure 5:
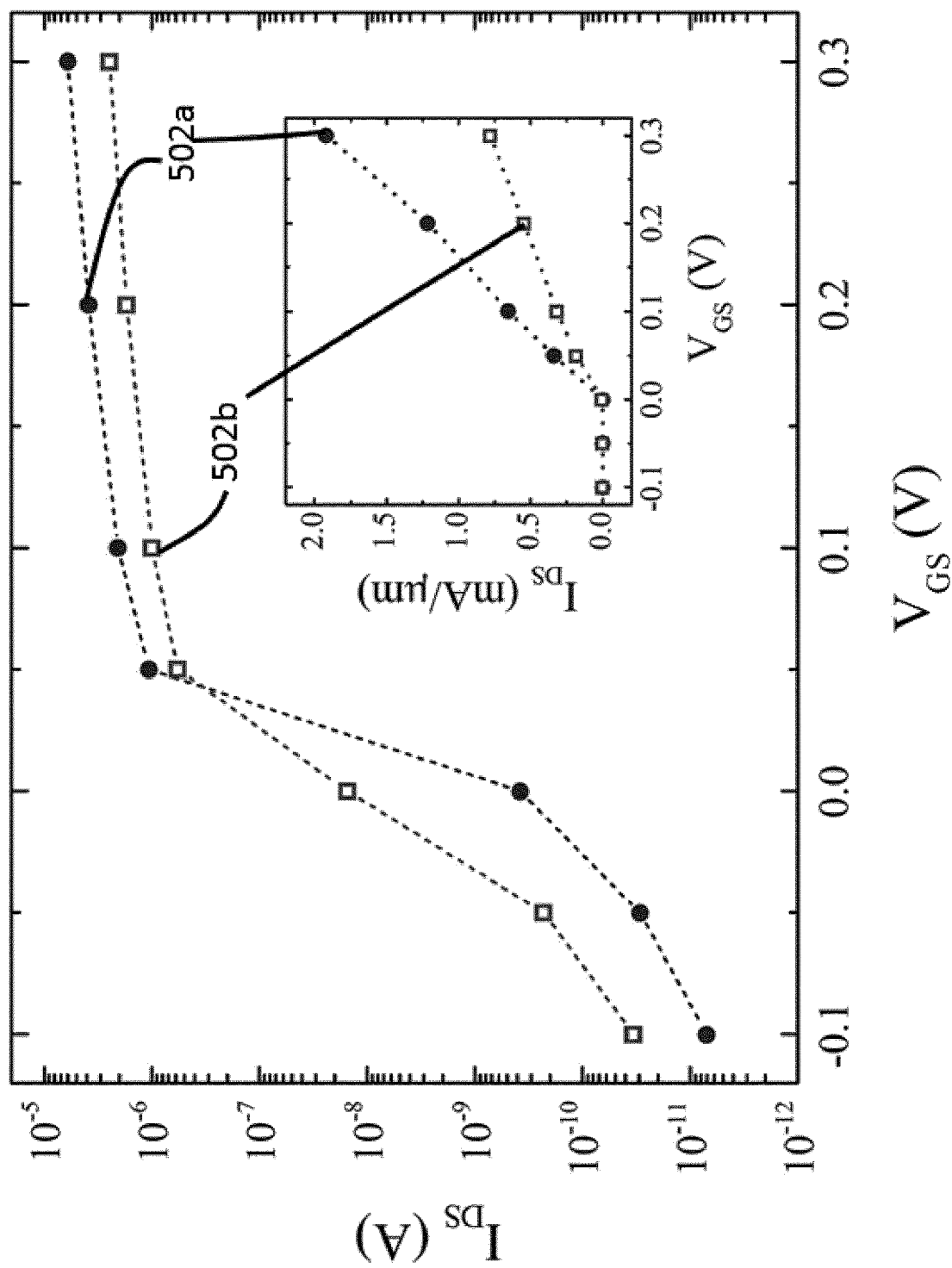
Figure 6:
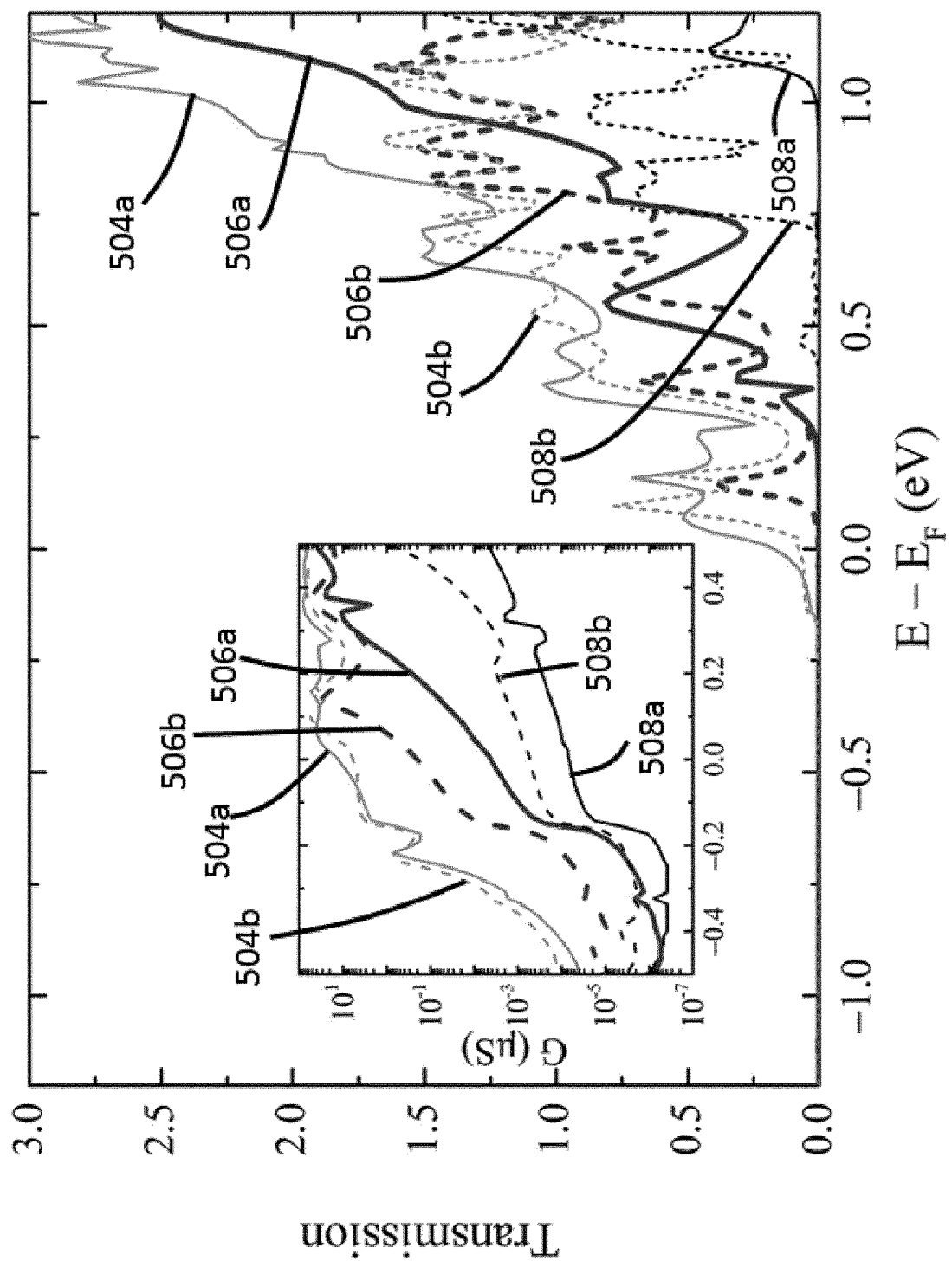
Figure 7:
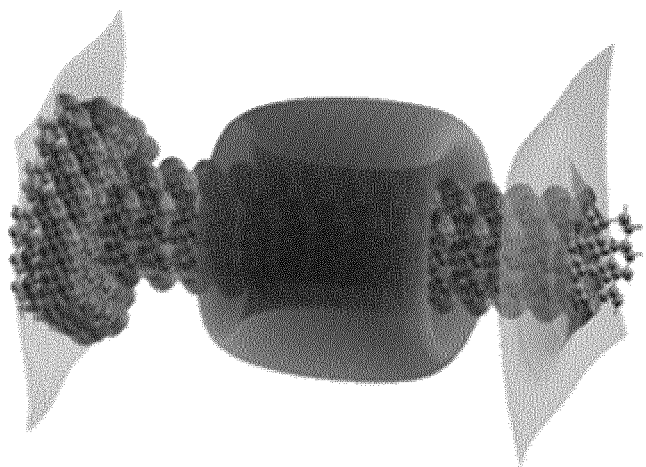

FIG. 2 schematically illustrates an example of the conduction band and valence band of a TFET based on a nanowire in (a) the ON state and (b) the OFF state;

FIG. 3A illustrates the local density of states for a tin nanowire based TFET of 1 nm diameter, in the ON state;

FIG. 3B illustrates the local density of states for a tin nanowire based TFET of 1 nm diameter, in the OFF state;

FIG. 4 shows an example band structure of a tin nanowire of 1 nm diameter with (a) no dopant; (b) $2.3 \times 10^{20}$ atoms/cm$^3$ n-type dopant; (c) $8 \times 10^{20}$ atoms/cm$^3$ n-type dopant; (d) $2.5 \times 10^{20}$ atoms/cm$^3$ p-type dopant; (e) $8 \times 10^{20}$ atoms/cm$^3$ p-type dopant;

FIG. 5 shows the $I_{DS}$-$V_{GS}$ characteristics of a tin nanowire based TFET of 1 nm diameter;

FIG. 6 shows the transmission characteristic of a tin nanowire based TFET of 1 nm diameter; and FIG. 7 shows an atomic scale illustration of the TFET of FIG. 1A.

Figure 1B:
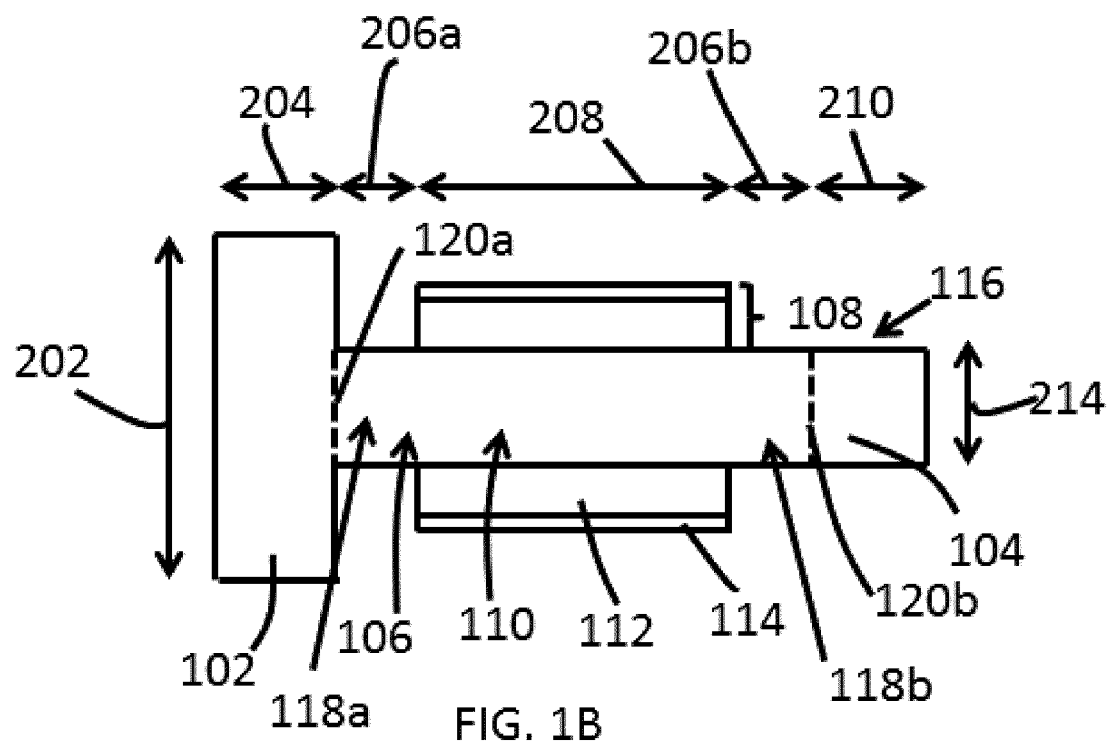
FIG. 1B is a cross-sectional view of the TFET of FIG. 1A.
Figure 1C:
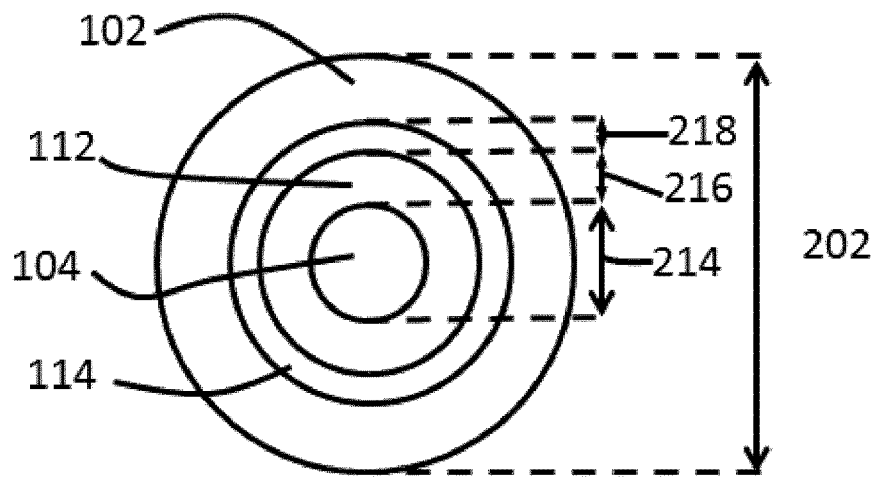
FIG. 1C is an end on view of the TFET of FIG. 1A.

FIGS. 1A to 1C schematically illustrate a TFET 100. FIG. 1A illustrates the TFET 100 in perspective view. FIG. 1B illustrates a cross section of the TFET 100 taken along line A-A' in FIG. 1A, and FIG. 1C illustrates an end on view of the TFET 100, taken along arrow B in FIG. 1A. It will be appreciated that FIGS. 1A to 1C are not drawn to scale, and the relative sizes of the various components may have been altered to clearly illustrate the structure of the TFET 100.

The TFET 100 is formed of a nanowire 116, and has a source region 102, a drain region 104, and a channel 106 extending between the source region 102 and the drain region 104. The nanowire 116 is formed from a single piece of semi-metal. A gate 108 is provided, which can be used to control conduction of carriers along the channel 106.

The use of a single piece of material means that the whole of the TFET 100 is formed from a continuous crystalline, polycrystalline or amorphous material, with no junctions or discontinuities, and there are no abrupt interfaces between different materials.

Below a threshold diameter, the nanowire 116 exhibits sufficient quantum confinement of the electronic states for it to exhibit semiconducting properties (band gap of >0 eV between the conduction band and the valence band). Above the threshold diameter, the nanowire 116 may exhibit low levels of quantum confinement, or no quantum confinement. In either case, the nanowire 116 exhibits metallic properties (overlapping conduction and valence bands) or semi-metallic properties (band gap of 0 eV). The properties of the nanowire 116 above the threshold diameter are the bulk properties of the material from which the nanowire 116 is made. In the TFET 100, the diameter 202 of the source region 102 is above the quantum confinement threshold, while the channel 106 and drain regions 104 have a diameter 214 below the quantum confinement threshold.

The drain region 104 is doped, with either n-type dopant or p-type dopant, and the remainder of the nanowire 116, including the source region 102 and the channel region 106 is intrinsic (undoped) material. The doping concentration in the doped region is between $10^{14}$ atoms/cm$^3$ and $10^{23}$ atoms/cm$^3$. Ideally this doping concentration is above $10^{20}$ atoms/cm$^3$, although this is not essential. The dopant can be introduced by any suitable doping technique. A sharp (abrupt) boundary is formed between the doped and undoped regions.

There may be dopant present on the channel 106 side of the doping boundary. This may be from diffusion of dopant out of the doping region, or from unintentional doping of the channel region 106 (for example impurities and the like). The dopant in the channel region 106 may be the same as, or different from, the dopant in the drain 104.

In general, on the undoped side of the doping boundary, the doping concentration is below a threshold amount, while on the doped side of the boundary, the doping is above the threshold amount. The doping on the undoped side of the boundary is preferably at least five orders of magnitude below the doping concentration on the doped side, and so can be considered negligible, and has negligible effect.

The boundary between the source 102 and the channel 106 is a boundary between a region that shows bulk properties (with low or no quantum confinement) and a region that shows sufficient quantum confinement to show a band gap. This means that there are offsets in the conduction and/or valence bands at the boundary. The offset(s) provide a first quasi-junction 120a, which may be equivalent to a heterojunction or homojunction. This can be considered a quasi-junction since the electronic structure shows a discontinuity in the band structure (with possible associated depletion region), and is electronically equivalent to the band structure seen at a junction.

Doping the drain region 104 narrows the band gap between the conduction band and valence band in the drain region 104, causing be further offsets between the conduction and/or valence bands at the boundary between the channel 106 and the drain 104. The further offsets provide a second quasi-junction 120b at the boundary between the drain region 104 and the channel region 106. The second quasi-junction 120b is electronically equivalent to a heterojunction or homojunction.

The first and second quasi-junctions 120a, 120b, are formed without requiring changes in the material composition.

The diameter 202 of the source region 104 and the diameter 214 of the channel 106 and drain 104 regions, and the type and exact level of doping are dependent on the material used. This will be discussed in more detail below.

The source region 102 has a source length 204 along the length of the nanowire 116. The drain region 104 has a drain length 210 along the length of the nanowire 116.

The channel 106 between the source 102 and the drain 104 is comprised of a gate overlapped region 110, where the gate 108 overlies the channel 106, a source-channel interface region 118a, between the source region 102 and the gate overlapped region 110, and a drain-channel interface region 118b, between the gate overlapped region 110 and the drain region 104.

The gate overlapped region 110, and hence the gate 108 has a gate length 208 along the length of the nanowire 116. The source-channel interface region 118a and drain-channel interface region 118b have respective interface lengths 206a, 206b. The channel length is the sum of the gate length 208, the first interface length 206a, and the second interface length 206b.

In general, the source length 204, the source-channel interface length 206a, the gate length 208, the drain-channel interface length 206b, and the drain length 210 may be greater than a few atomic layers and of unlimited length. For example, the source length 204, the source-channel interface length 206a, the gate length 208, the drain-channel interface length 206b, and the drain length 210 may be between 1 nm and 10 microns.

The gate 108 is formed of a dielectric region 112 provided around the channel 106, and a gate electrode 114 provided on top of the dielectric region 112. The dielectric region 112 has dielectric thickness 216, and a dielectric constant of 1 to 1000. The electrode 114 has an electrode thickness 218.

The dielectric thickness 216 and electrode thickness 218 may be greater than a few atomic layers and of unlimited thickness. For example, the dielectric thickness 216 and electrode thickness 218 may be between 1 nm and 5 microns.

The TFET 100 is operated as a switch, having an OFF state, where there is no (or low) conductance through the device, and an ON state where there is high conductance.

FIG. 2 shows an example of the relative alignments of the conduction band 302 and valence band 304 along the length of the nanowire 116, with band offsets in both the conduction band and valence band. The band diagram shows the lower edge of the conduction band 302 and the upper edge of the valence band 304.

The source 102 is not a semiconductor and is metallic or semi-metallic in behaviour, and so the upper edge of the source valence band 304a and lower edge of the source conduction band 302a coincide or overlap. Electrons occupy the band, as shown by the shading.

In the channel 106, there is a bandgap between the channel valence band 304b, and the channel conduction band 302b. The drain 104 a different band gap provided between the drain valence band 304c and the drain conduction band 302c. The drain 104 is arranged (for example through the choice of doping and the like) to have a Fermi level higher than the lower edge of the drain conduction band 302c. The band structure of the drain 104 is occupied by electrons up to the Fermi level 306, as shown by the shading.

The upper part (a) of FIG. 2 shows the band alignments in the ON state, while the lower part (b) shows the band alignments in the OFF state.

In the ON state, a first voltage is applied to the gate 108, which shifts the channel conduction band 302b and the channel valence band 304b into alignment with the drain conduction band 302c and the drain valence band 304c, and which shifts the lower edge of the channel conduction band 302b below the occupation level of the source 102.

In the ON state, the current transport mechanism is a combination of:

Direct tunnelling and band-to-band tunnelling 308 from the source region 102 to the drain conduction band 302c, through the channel conduction band 302b; and Short channel tunnelling 310 from the source region 102 to the drain conduction band 302c, across a barrier formed by the band gap in the channel region 106.

The tunnelling 308 through the conduction band 302 is significantly larger than the short channel tunnelling 310, and is the dominant transport process. In the ON state, the short channel tunnelling 310 may be considered negligible.

The first voltage is the same, or higher than, a threshold voltage required to turn the TFET into the ON state. The threshold voltage is the lowest voltage at which tunnelling 308 through the conduction band 302 occurs.

In the OFF state, a second voltage is applied to the gate 108. In the OFF state, the channel conduction band 302b is shifted above the occupation level of the source 102. The band gap of the channel 106 is unchanged so the channel valence band 304b also shifts.

In the OFF state, the direct tunnelling is suppressed due to the band offset between the source region 102 and the channel region 106, and short channel tunnelling 310 is the dominant component of the current. This can be reduced by increasing the channel length, and so can be considered negligible in some cases, as the probability of tunnelling decreases.

The first and second voltages may be any suitable value (including 0 V).

In one example, the nanowire 116 is made of tin with the orientation of <110> along the length of the nanowire 116. From density functional theory (DFT) calculations, the threshold diameter for showing quantum confinement is approximately 4 nm, so the channel 106 and drain 104 have a diameter of less than or equal to 4 nm and the source region 102 has a diameter of at least 4 nm.

In one example of a tin nanowire based TFET 100, the channel 106 and drain 104 have a diameter of 1 nm, and show quantum confinement, with a band gap in the band structure, and the source region 102 has a diameter of 5 nm, and exhibits metallic behaviour. The source length 204 and drain length 210 are both 1 nm, and the channel length is 5 nm.

FIG. 3A shows the local density of states (LDOS) along the length of the tin based TFET described above, for the ON state (gate voltage=0.2 V, source-drain voltage=0.3V). FIG. 3B shows the LDOS for the OFF state (gate voltage=−0.1V, source-drain voltage=0.3V) of the same TFET 100. The y-axis represents the length along the nanowire 116, and the x-axis is the energy level relative to the source Fermi level. On the y-axis, the first quasi-junction 120a is at 1 nm and the second quasi-hetrojunction 120b is at 6 nm. These plots illustrate the transport mechanisms discussed generally with reference to FIG. 2.

FIG. 4 shows the effect that doping can have on the band structure of a tin nanowire of 1 nm diameter. Plot (a) shows the band structure of an intrinsic (undoped) tin nanowire. Plot (b) shows the band structure of a tin nanowire, with antimony doping, at doping concentration of $2.3 \times 10^{20}$ atoms/$cm^3$ (n-type DP2). Plot (c) shows the band structure of a tin nanowire, with antimony doping, at doping concentration of $8 \times 10^{20}$ atoms/$cm^3$ (n-type DP1). Plot (d) shows the band structure of a tin nanowire, with indium doping, at doping concentration of $2.3 \times 10^{20}$ atoms/$cm^{+3}$ (p-type DP2). Plot (e) shows the band structure of a tin nanowire, with indium doping, at doping concentration of $8 \times 10^{20}$ atoms/$cm^3$ (p-type DP1).

As can be seen from FIG. 4, for DP1 a periodic array of dopants modifies the band gap considerably due to strong coupling between the dopant atoms. For DP2, the nanowire is still very highly doped and creates a degenerate semiconductor.

The curvature of the first energy sub-band in the nanowire conduction band is similar for the intrinsic nanowire, and n-type DP2 doping, while it is slightly modified for n-type DP1 doping. This corresponds to almost equal electron effective mass for the doped and intrinsic nanowires (i.e., $m_{c,int}$=0.089 $m_0$, $m_{c,DP1}$=0.109 $m_0$, and $m_{c,DP2}$=0.093 $m_0$). The change in curvature is more pronounced for p-type DP1 doping.

FIG. 5 shows the current passing through the channel 106 from the source 102 to the drain 104 ($I_{DS}$) as a function of the gate voltage ($V_{GS}$) for a fixed source-drain voltage of 0.3V, in semi-log scale, at room temperature. The I-V characteristic has been calculated for the example tin nanowire discussed above. A first I-V plot 502a is for n-type DP1 doping, and a second 502b is for n-type DP2 doping.

Ideally, for any FET, the source-drain current will be low (preferably 0 A) for an OFF state, and high for an ON state, with a step change at the threshold voltage where the FET switches from OFF to ON. In real devices that do not show a step change, the subthreshold slope (SS) is used to characterise how close to the ideal the FET is. For a step change, the SS=0, which increases as the FET moves away from ideal behaviour. For MOSFETs, the minimum SS that can be achieved is ~60 mV/dec at room temperature.

The SS extracted from FIG. 5 is 22 mV/dec for n-type DP1 doping and 30 mV/dec for n-type DP2 doping. This indicates that an SS lower than the theoretical limit of conventional FET is achievable. This is due to the suppression of thermionic emission in the OFF state of the TFET 100 configuration. Smaller SS provides more energy efficiency and a faster device.

The inset shows the current density (in mA/µm) versus the gate voltage in linear scale, showing an ON current of 1.5 mA/µm and an OFF current of 2.26 nA/µm. This ON current is higher than for standard TFETs.

FIG. 6 shows the transmission characteristic of the example TFET 100 discussed above. A first curve 504a shows the transmission characteristic for a gate voltage of 0.1V (ON state) and n-type DP1 doping, and a second curve 504b shows the transmission characteristic for the ON state with n-type DP2 doping. A third curve 506a shows the transmission characteristic for a gate voltage of 0V (intermediate state) and n-type DP1 doping, and a fourth curve 506b shows the transmission characteristic for the intermediate state with n-type DP2 doping. A fifth curve 508a shows the transmission characteristic for a gate voltage of −0.1V (OFF state) and n-type DP1 doping, and a sixth curve 508b shows the transmission characteristic for the OFF state with n-type DP2 doping. The quantum conductance which is defined as $G(E)=2e^2/h \cdot T(E)$ is also illustrated in the inset of FIG. 6 in semi-log scale.

As can be seen, the transmission is suppressed under the OFF-state condition (i.e., $V_{GS}$=−0.1 V); however, by applying positive gate voltage (i.e., $V_{GS}$=0.1 V), conductivity increases more than 5 orders of magnitude.

The person skilled in the art will appreciate that there may be numerous ways to produce TFETs 100 as described above. In one example, a layer of intrinsic semi-metal material is grown or deposited (for example by an epitaxial or crystal growth process). The semi-metal is then etched in a first etching step to form the source region 102, and in a second etching step to form the drain 104 and channel 106. The gate is then formed by deposition of the gate dielectric 112 and the electrode 114. The drain region 104 can then be doped using known techniques. The selective etching, deposition and doping is achieved using lithographic masks.

The dielectric region 112 may be formed of any form of oxide, such as silicon dioxide, silicon oxide, silicon monoxide, or any form of nitride, including silicon nitride, silicon oxynitride, alkali halides (e.g., rubidium bromide and lithium fluoride), barium titanate ($BaTiO_3$), lead titanate ($PbTiO_3$), or any form of metal oxides (e.g., hafnium oxide, tantalum oxide, tungsten oxide and zirconium oxide). The electrode 114 may be formed of any metal or doped/undoped polysilicon, poly SiGe, Nickel (Ni) silicide, or graphene.

The person skilled in the art will also appreciate that there are many suitable methods for making electrical connections to the source 102, drain 104 and gate 108. They will also appreciate that many thousands (or more) of TFETs may be provided on a single chip in a circuit, and the TFETs 100 may be interconnect using known methods.

In the example discussed, the source region 102, drain region 104 and the channel region 106 each have constant diameter. However, it will be appreciated that the diameter may vary within the different regions, provided the source region 104 remains above the threshold diameter, and the channel region 106 and the drain region 104 remain below the threshold diameter.

The variation in diameter may be by design. For example, the channel region diameter 214 may taper from the source 102 to the drain region 104 (or vice versa), or the channel diameter 214 may have a non-uniform diameter, which varies along the length of the channel.

The variation in diameter may also be unintentional. For example, non-uniformity in the etching process, and variation in the position of atoms in the structure of the nanowire 116 may cause local changes in the diameter of the nanowire 116. This is shown in FIG. 7, which shows an atomic scale illustration of TFET 100, assuming perfect etching and/or growth steps. As can be seen, the atomic structure causes variations in the diameter of the nanowire. In general, variation in the diameter caused by low (e.g. atomic) level variation is considered negligible, and so the example shown in FIG. 7 would be considered to have a constant diameter along the channel 106.

In FIG. 7, surface dangling bonds can be saturated by hydrogen or any other material selected from the list including but not limited to: any of the halogen atoms, hydroxyl, and methyl group (—$CH_3$). The applied gate bias voltage is depicted as an isopotential surface.

Also, in the above examples, the channel 106 has the same diameter as the drain region 104. However, in some examples, the channel region 106 and the drain region 104 may have different diameters, below the quantum confinement threshold.

It will be further appreciated that although the above example shows an abrupt change in diameter at the first quasi-junction 120a which forms a right angle (90 degrees), there may not always be such an abrupt change. The change in size may be graded along an angle, which may be smaller or larger than 90 degrees. This may be, for example, a result of limitations in the etching or lithography procedure or material growth/deposition conditions. Alternatively, the graded change in diameter could be by design. The change in diameter should be sufficiently abrupt that the first-quasi junction 120a forms a junction having sufficient carrier injection.

Similarly, the doping boundary between the channel 106 and the drain 104 may be formed from a gradual change in doping concentration, rather than an abrupt change, providing the carrier injection is sufficient to form a junction.

The above examples also show band gap narrowing in the drain 104 compared to the channel. The band gap narrows when the doping level is sufficiently high. In nanoscale devices, a relatively low number of dopants is sufficient to cause band gap narrowing, compared to the number of dopants required in larger scale devices. However, it will be appreciated that the drain 104 and channel 106 may have the same band gap, in some examples. Where the band gap in the channel 106 is the same as the drain 104, the doping boundary may shift the conductance band and/or valence band without altering the bandgap, to obtain offset(s) at the drain channel interface and form the second quasi-junction. The gate voltage may also be used as well as or instead of this.

Tin is only one example of a material that may be used in the TFET 100. Any semi-metallic material could be used. For example, the nanowire may be bismuth, antimony, arsenic or carbon. In other examples, alloys of tin, bismuth, antimony or arsenic could be used. Any semi-metallic carbon allotropes could be used.

The use of alloys allows strain to be incorporated, due to the difference in size between the atoms of the alloy materials, thereby further tuning the band gap of the nanowire 116.

The above materials are by way of example only, and any suitable material may be used. Each material has a different threshold for exhibiting quantum confinement. The procedure needed to determine the threshold diameter will be apparent to the person skilled in the art. For example, DFT calculations may be used to determine the variation of the band structure at room temperature, as a function of the dimensions of the material. This can be used to determine the threshold size at which a material starts to exhibit a band gap, and hence semiconducting properties. It will be appreciated that DFT can underestimate the band gap. It will also be appreciated that other band gap calculations, or direct measurements of the band gap, may also be used.

The threshold diameter is the same as or less than the Fermi wavelength of the carriers in the material. The Fermi wavelength is the characteristic scale above which electrons and holes behave as bulk charge carriers. Below the Fermi wavelength, the quantum confinement is predominant.

Any suitable dopant may also be used. Any group III element may be used for p-type dopant, and any group V element may be used for n-type dopant. For example, the dopant may be indium (p-type) and antimony (n-type).

In the above example, the drain-channel interface region 118b is undoped. However, in other examples, the drain-channel interface region 118b may also be doped. The doping of the drain-channel interface region 118b can also be within $10^{14}$ atoms/cm$^3$ and $10^{23}$ atoms/cm$^3$ (and preferably, but not essentially above $10^{20}$ atoms/cm$^3$). The doping level in the drain-channel interface region 118b is sufficiently high that the second quasi-junction 120b is still formed, now located between the overlapped region 108 and the drain-channel interface region 118b.

In the example shown, the gate 108 is an all around gate, which is provided around the circumference of the nanowire 116, along the gate length 208. However, it will be appreciated that the gate may be a multi-gate, tri-gate, Omega structure or double gate. Furthermore, the dielectric 112 may extend further along the channel than the electrode 114, allowing the gate dielectric 112 to perform a surface passivation function. In one example, the gate dielectric 112 runs the full length of the channel 106. In these examples, the gate length will be considered as the length of the electrode 114.

In the above examples, the gate 108 overlaps a portion of the channel 106, with interface regions 118 between the overlapped region and the source 102 and drain 104. It will be appreciated that in some examples, one or both of the interface regions 118 may be omitted. In some cases, the gate 108 may overlap the whole length of the channel 106.

In the above example, the dielectric thickness is constant. However, in other examples, the dielectric thickness 216 may vary along the length of the channel 106. The electrode thickness may also vary along the channel 106.

In the above, the TFET 100 is described as being formed from a single semi-metal material. It will be appreciated that this will include any natural variation in the composition or structure, impurities, and the like.

In other examples, the TFET 100 may be formed from a composition of different materials. For example, the source 102, channel 106 and drain 104, may all be formed of different materials, the source 102 and drain 104 may be formed of a first material, and the channel 106 formed from a second material, or the channel 106 may be formed of the same material as one of the source 102 or drain 104, with the other being formed from a different material. In all cases, the channel 106 is formed of a material that behaves as a metal or semi-metal in the bulk, and a semiconductor once sufficient quantum confinement is present.

In the above, the TFET has been described in terms of a cylindrical nanowire 116 having a diameter, which is a quasi-one-dimensional cylindrical structure. It will be appreciated that the TFET 100 may be formed in any other suitable shape of nanowire 116 having a diameter or thickness that causes the nanowire to exhibit quantum confinement. For example, the nanowire 116 may have a cross section that is square, rectangular or triangular. In further alternative examples, any suitable one dimensional system that exhibits changes in the energy levels with changing dimensions, may be used, for example another nanostructure.

The TFET has also been described in terms of negative charge carriers, however, it will be appreciated that charge transport may also be through positive carriers.

The invention claimed is:

1. A tunnel field effect transistor, comprising:
a source;
a drain; and
a channel extending between the source and the drain, wherein the source, the drain and the channel are formed of a same material, the material comprising a material that behaves as a metal or semi-metal in bulk; and wherein:
the channel and the drain each have a diameter or thickness that is smaller than a threshold size, the threshold size being the size at or below which the material exhibits quantum confinement such that it behaves as a semiconductor; and
the source has a diameter or thickness that is larger than the threshold size, wherein the threshold size is a Fermi wavelength of charge carriers in the material.

2. The tunnel field effect transistor of claim 1, wherein the tunnel field effect transistor is formed of a nanowire incorporating the source, the drain and the channel, the nanowire having a diameter or thickness.

3. The tunnel field effect transistor of claim 2, wherein the nanowire has a cross-section that is circular, square, rectangular or triangular.

4. The tunnel field effect transistor of claim 2, wherein the diameter or thickness of the nanowire is altered between the source and the drain and channel, such that the channel and the drain exhibit sufficient quantum confinement such that the material is a semiconductor, and the source is metallic or semi-metallic.

5. The tunnel field effect transistor of claim 2, wherein the channel and the drain have the same diameter or thickness.

6. The tunnel field effect transistor of claim 1, wherein the drain is doped.

7. The tunnel field effect transistor of claim 6, wherein the drain is either n-type doped or p-type doped.

8. The tunnel field effect transistor of claim 6, comprising a doping boundary between the channel, and the doped drain.

9. The tunnel field effect transistor of claim 1, wherein a change in size from the source to the channel comprises either a step change or graded change in the size, or wherein the change in size from the source to the channel causes shifts in energy levels, such that the change in size is electronically equivalent to a step or gradual heterojunction or homojunction.

10. The tunnel field effect transistor of claim 1, comprising a gate overlapping the channel, the gate constructed and arranged to allow or restrict conduction through the channel, wherein the gate comprises a gate electrode, and gate dielectric provided between the channel and the gate electrode, wherein the gate electrode overlaps a portion of a whole length of the channel or the whole length of the channel, such that the channel comprises an overlapped region where the gate overlaps the channel.

11. The tunnel field effect transistor of claim 10, wherein the gate overlaps a portion of the channel, such that the channel comprises one or more non-overlapped regions, where the gate does not overlap the channel.

12. The tunnel field effect transistor of claim 11, comprising a first non-overlapped region of the channel between the source and the overlapped region; and a second non-overlapped region between the overlapped region and the drain or a doped second non-overlapped region between the overlapped region and the drain.

13. The tunnel field effect transistor of claim 1, wherein the material is selected from a list including: tin; bismuth; antimony; arsenic; carbon; tin alloys; bismuth alloys; antimony alloys; arsenic alloys; and carbon allotropes.

14. The tunnel field effect transistor of claim 1, wherein the material is an alloy including a constituent configured to introduce strain into a lattice of the material.

15. The tunnel field effect transistor of claim 1, having a subthreshold slope of less than 60 mV/dec.

16. The tunnel field effect transistor of claim 1, wherein the source, the drain and the channel are formed from a single continuous piece of the material.

17. A method of forming a tunnel field effect transistor comprising:
providing a body of first material, the first material comprising a material that behaves as a metal or semi-metal in bulk;
forming a drain and channel from the first material to have a diameter or thickness smaller than a threshold size at or below which the first material exhibits quantum confinement such that it behaves as a semiconductor, wherein the threshold size is a Fermi wavelength of charge carriers in the first material;
forming a source from the first material to have a diameter or thickness larger than the threshold size, the channel extending between the source and the drain;
doping the drain; and
forming a gate over a portion of the channel or a whole of the channel, such that the body forms a three terminal device.

18. A tunnel field effect transistor having a source, a drain, and a channel extending between the source and the drain, wherein:
the source exhibits metallic or semi-metallic properties;
the channel and the drain exhibit semiconducting properties; and
at least the channel is formed of a material that exhibits metallic or semi-metallic bulk properties, and has a diameter or thickness that is smaller than a threshold size, the threshold size being the size at or below which the material exhibits quantum confinement such that it behaves as a semiconductor, wherein the threshold size is a Fermi wavelength of charge carriers in the material.

* * * * *